US011315982B2

(12) United States Patent
Zhou et al.

(10) Patent No.: US 11,315,982 B2
(45) Date of Patent: Apr. 26, 2022

(54) LIGHT EMITTING DIODE WITH A PATTERNED SCATTERING LAYER AND FABRICATION METHOD THEREOF, DISPLAY SUBSTRATE AND DISPLAY PANEL

(71) Applicant: BOE TECHNOLOGY GROUP CO., LTD., Beijing (CN)

(72) Inventors: Qingchao Zhou, Beijing (CN); Shengji Yang, Beijing (CN); Xiaochuan Chen, Beijing (CN); Qing Wang, Beijing (CN); Luyang Zhou, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 130 days.

(21) Appl. No.: 16/638,576

(22) PCT Filed: Dec. 5, 2018

(86) PCT No.: PCT/CN2018/119332
§ 371 (c)(1),
(2) Date: Feb. 12, 2020

(87) PCT Pub. No.: WO2020/113458
PCT Pub. Date: Jun. 11, 2020

(65) Prior Publication Data
US 2021/0217825 A1 Jul. 15, 2021

(51) Int. Cl.
*H01L 27/32* (2006.01)
*H01L 51/52* (2006.01)
*H01L 51/56* (2006.01)

(52) U.S. Cl.
CPC ........ *H01L 27/3213* (2013.01); *H01L 27/322* (2013.01); *H01L 51/5268* (2013.01); *H01L 51/5271* (2013.01); *H01L 51/56* (2013.01)

(58) Field of Classification Search
USPC .......... 257/40
See application file for complete search history.

(56) References Cited

U.S. PATENT DOCUMENTS 5,786,665 A * 7/1998 Ohtsuki .............. G02B 6/0023 313/512
7,888,858 B2 2/2011 Cok et al.
(Continued)

FOREIGN PATENT DOCUMENTS

CN 100505371 C 6/2009
CN 100530751 C 8/2009
(Continued)

OTHER PUBLICATIONS

Office Action dated Jul. 22, 2020, issued in counterpart CN Application No. 201880002335.3, with English translation. (19 pages).
(Continued)

*Primary Examiner* — Nduka E Ojeh
(74) *Attorney, Agent, or Firm* — WHDA, LLP

(57) ABSTRACT

A light emitting diode includes a pixel unit. The pixel unit may include a first sub-pixel configured to emit white light. The first sub-pixel may include a first microcavity adjustment layer, a scattering layer, a first transparent electrode layer, a first emitting layer, and a first semi-transparent electrode layer. The scattering layer includes a plurality of patterns formed on a surface of the scattering layer. The scattering layer may be configured to reduce color cast of the first sub-pixel to be less than about 0.025 at viewing angles in a range of about −50 degree to +50 degree.

19 Claims, 6 Drawing Sheets

(56) References Cited

U.S. PATENT DOCUMENTS

| | | | | |
|---|---|---|---|---|
| 2009/0051283 | A1 | 2/2009 | Cok et al. | |
| 2009/0051284 | A1* | 2/2009 | Cok | H01L 51/5265 313/506 |
| 2015/0064826 | A1 | 3/2015 | Jo et al. | |
| 2015/0228929 | A1 | 8/2015 | Lamansky et al. | |
| 2017/0250233 | A1* | 8/2017 | Ushikubo | H01L 51/5271 |
| 2018/0143360 | A1* | 5/2018 | Frey | G02B 5/3058 |
| 2018/0172979 | A1* | 6/2018 | Yao | G06F 3/0421 |
| 2019/0086587 | A1 | 3/2019 | Qu et al. | |

FOREIGN PATENT DOCUMENTS

| | | | |
|---|---|---|---|
| CN | 102473718 | A | 5/2012 |
| CN | 103325809 | A | 9/2013 |
| CN | 103885106 | A | 6/2014 |
| CN | 105489780 | A | 4/2016 |
| CN | 106025091 | A | 10/2016 |
| CN | 106449703 | A | 2/2017 |
| CN | 107123662 | A | 9/2017 |
| CN | 107195799 | A | 9/2017 |
| CN | 107608012 | A | 1/2018 |
| CN | 108666445 | A | 10/2018 |
| JP | WO2015194359 | A1 | 4/2017 |

OTHER PUBLICATIONS

International Search report dated Aug. 28, 2019, issued in counterpart Application No. PCT/CN2018/119332. (10 pages).

* cited by examiner

LIGHT EMITTING DIODE WITH A PATTERNED SCATTERING LAYER AND FABRICATION METHOD THEREOF, DISPLAY SUBSTRATE AND DISPLAY PANEL

TECHNICAL FIELD

This disclosure relates to display technology, more particularly, to a light emitting diode and a fabrication method thereof, a display substrate and a display panel.

BACKGROUND

In recent years, micro monitor or display apparatus usually includes a silicon-based organic light emitting diode (OLED) due to its advantage such as super high Pixel Per Inch (PPI) and a wide range of operating temperatures. But relatively low luminance of the silicon-based organic light emitting diode (OLED) limits its use in Augmented Reality (AR) and Virtual Reality (VR) area.

BRIEF SUMMARY

Accordingly, one example of the present disclosure is a light emitting diode. The light emitting diode may include a pixel unit, which includes a first sub-pixel configured to emit white light. The first sub-pixel may include a first microcavity adjustment layer, a scattering layer, a first transparent electrode layer, a first emitting layer, and a first semi-transparent electrode layer. The scattering layer may be configured to reduce color cast of the first sub-pixel to be less than about 0.025 at viewing angles in a range of about −50 degree to +50 degree.

Another example of the present disclosure a display substrate. The display substrate may include a light emitting diode according to one embodiment of the present disclosure.

Another example of the present disclosure is a display apparatus. The display apparatus may include a display substrate according to one embodiment of the present disclosure.

Another example of the present disclosure is a method of fabricating a light emitting diode. The method may include forming a first microcavity adjustment layer in a first sub-pixel configured to emit white light, forming a scattering layer on the first microcavity adjustment layer, forming a first transparent electrode layer on the scattering layer, forming a first emitting layer on the first transparent electrode layer, and forming a first semi-transparent electrode layer on the first emitting layer.

BRIEF DESCRIPTION OF THE DRAWINGS

The subject matter which is regarded as the disclosure is particularly pointed out and distinctly claimed in the claims at the conclusion of the specification. The foregoing and other objects, features, and advantages of the disclosure are apparent from the following detailed description taken in conjunction with the accompanying drawings in which:

DETAILED DESCRIPTION

Figure 1:
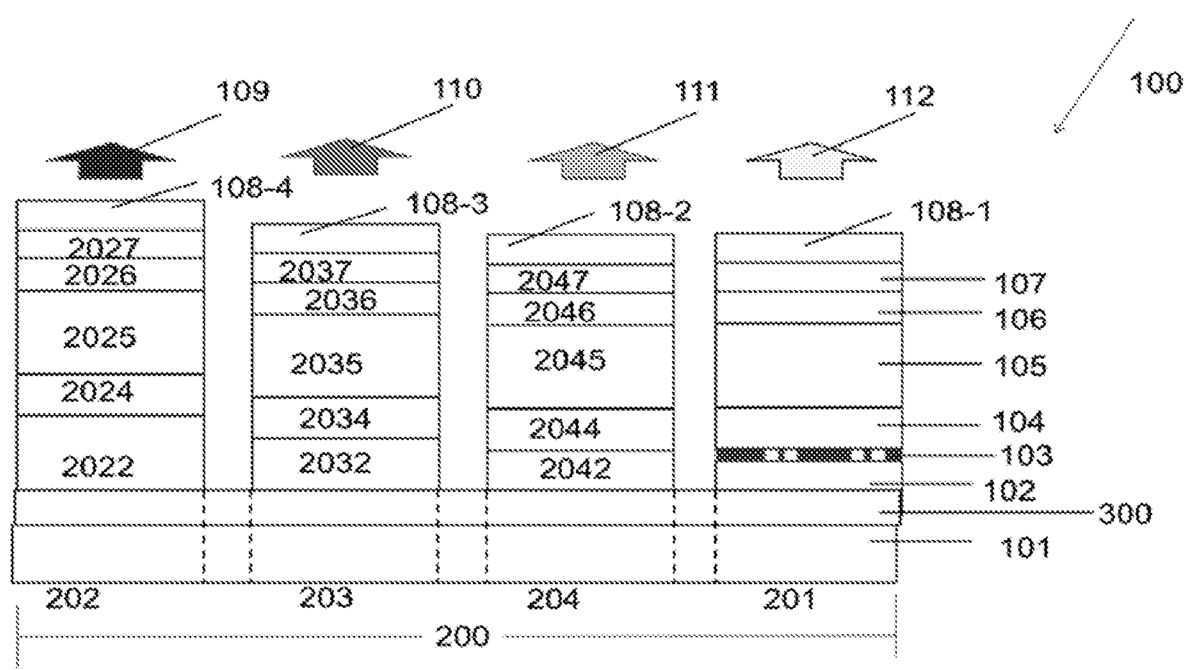
FIG. 1 a schematic diagram illustrating structure of a light emitting diode according to some embodiments of the disclosure.

The present disclosure will be described in further detail with reference to the accompanying drawings and embodiments in order to provide a better understanding by those skilled in the art of the technical solutions of the present disclosure. Throughout the description of the disclosure, reference is made to FIGS. 1-6. When referring to the figures, like structures and elements shown throughout are indicated with like reference numerals.

In the description of the specification, references made to the term "one embodiment," "some embodiments," and "exemplary embodiments," "example," and "specific example," or "some examples" and the like are intended to refer that specific features and structures, materials or characteristics described in connection with the embodiment or example that are included in at least some embodiments or example of the present disclosure. The schematic expression of the terms does not necessarily refer to the same embodiment or example. Moreover, the specific features, structures, materials or characteristics described may be included in any suitable manner in any one or more embodiments or examples.

A numerical range modified by "about" herein means that the upper and lower limits of the numerical range can vary by 10% thereof.

In recent years, silicon-based OLED microdisplays have been used as near-eye displays in the VR/AR field. Because of maturity of silicon-based semiconductor CMOS processes, ultra-high PPI displays can be realized, and the OLED displays can be used over a wide temperature range. However, relatively low brightness of silicon-based OLED displays currently limits their applications in AR and even VR.

RGBW pixel arrangement is a way to improve the brightness of OLED apparatuses. By increasing proportion of white (W) pixels in the pixel arrangement, the brightness can be greatly improved. In addition, an application of strong microcavity effect is another effective means to improve the brightness of silicon-based OLED apparatuses. Red (R), Green (G), and Blue (B) colors in the EL spectrum can be enhanced by utilizing the RGB microcavities separately. The enhanced RGB spectra are then combined to produce the final color to be displayed with enhanced brightness. However, the strong microcavity effect will also bring about serious problems such as high color cast when the brightness of the apparatus is improved. That is, as the viewing angle increases, the wavelength of the resonance period in the emission spectrum of the EL will shift blue, resulting in color cast of the displayed image. The stronger the microcavity effect, the more serious the color cast is. Usually, this problem of color cast can be significantly reduced after the EL spectrum passes through a color film (CF), because most of the light in the EL spectrum is filtered out by CF.

However, in the RGBW pixel arrangement, the W pixel is designed to improve the overall light extraction rate and brightness of the apparatus. The color film corresponding to the W pixel does not filter the light from the W pixel. Therefore, there is a serious problem of apparent color cast for W pixels due to the strong microcavity effect, thereby resulting in a decline in the display performance of the final silicon-based OLED apparatus.

Figure 2:
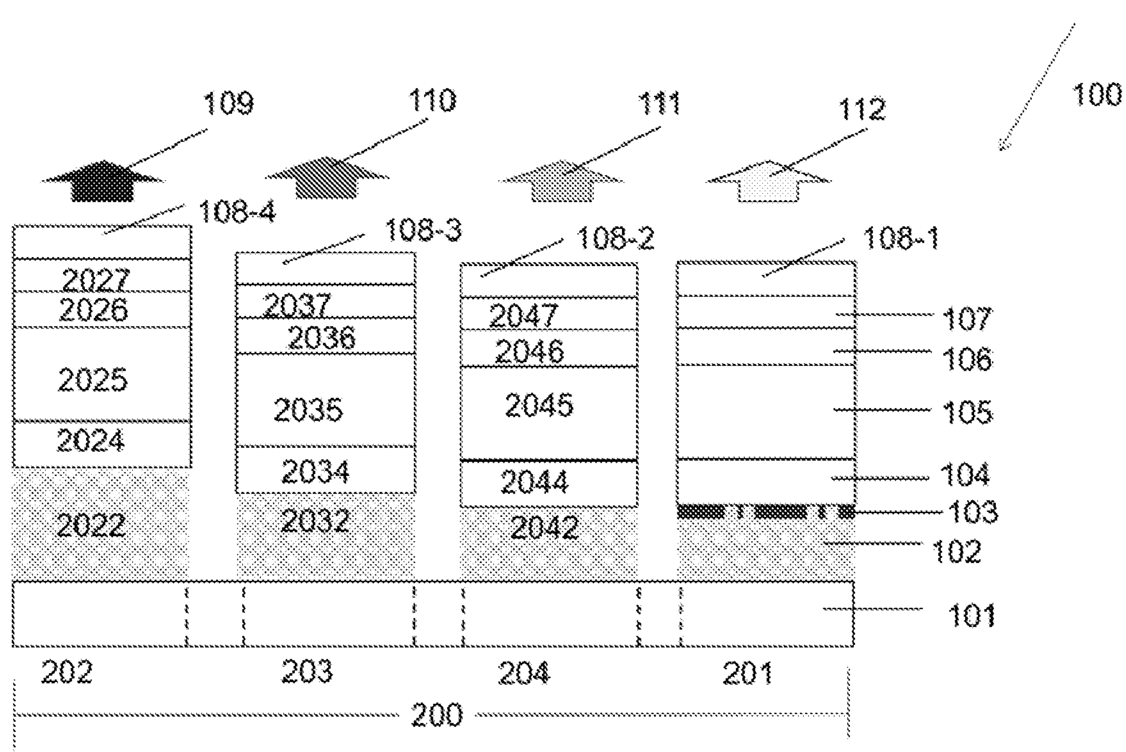
FIG. 2 is a schematic diagram illustrating structure of a light emitting diode according to some embodiments of the disclosure.

Accordingly, one example of the present disclosure is a light emitting diode. Referring to FIG. 1 and FIG. 2, according to some embodiments of the present disclosure, the light emitting diode 100 includes a pixel unit 200. The pixel unit 200 includes a first sub-pixel 201 for emitting white light. The first sub-pixel 201 includes a first microcavity adjustment layer 102, a scattering layer 103 formed on the first microcavity adjustment layer 102, a first transparent electrode layer 104 formed on the scattering layer 103, a first emitting layer 105 on the first transparent electrode layer 104, and a first semi-transparent electrode layer 106 formed on the first emitting layer 105. The first sub-pixel 201 is configured to emit white light 112 to improve luminance of the light emitting diode 100. The scattering layer is configured to scatter the white light transmitting though the scattering layer and reduce the microcavity effect of a first microcavity. In one embodiment, the scattering layer is configured to reduce color cast of the first sub-pixel to be less than about 0.025 at viewing angles in a range of about −50 degree to +50 degree.

Figure 3:
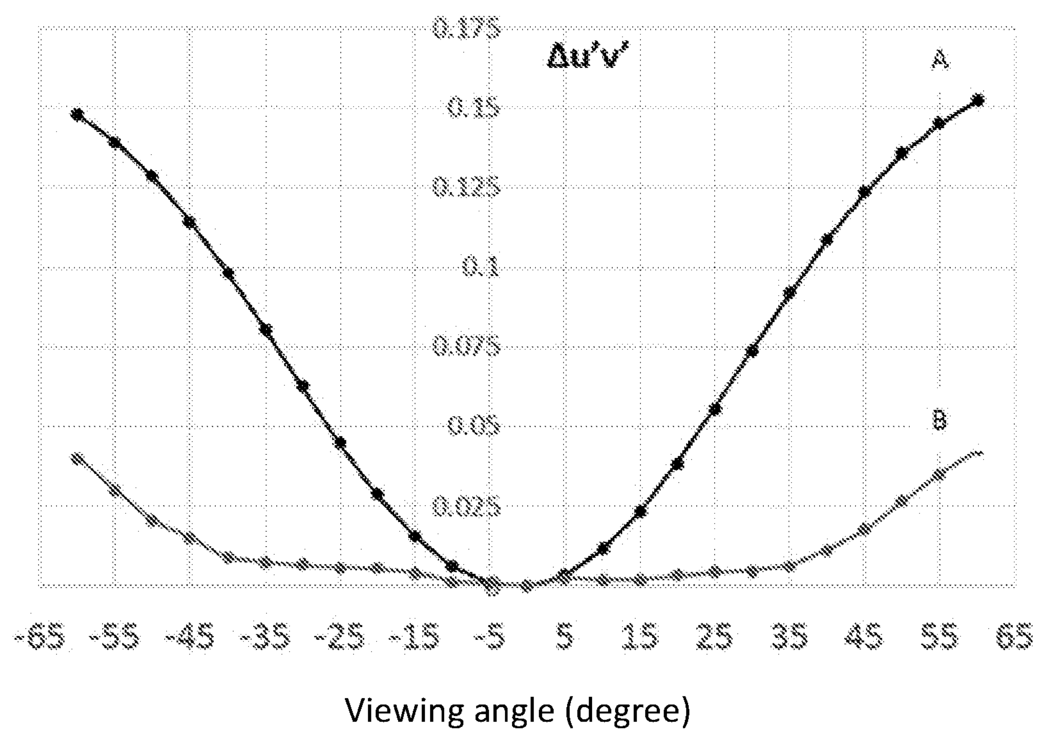
FIG. 3 shows comparison of color cast at different viewing angles of (A) a light emitting diode in the related art and (B) a light emitting diode according to some embodiments of the present disclosure.

FIG. 3 shows comparison of color cast at different viewing angles of (A) a light emitting diode in the related art and (B) a light emitting diode according to some embodiments of the present disclosure. As shown in FIG. 3, a viewing angle of the light emitting diode in the related art is in a range of −15 degree to +15 degree while color cast, Δu'v', thereof is smaller than about 0.025. In contrast, a viewing angle of the light emitting diode according to some embodiments of the present disclosure is in a range of about −50 degree to +50 degree while color cast, Δu'v', thereof is smaller than about 0.025. In some embodiments of the present disclosure, the viewing angle of the light emitting diode is in a range of about −45 degree to +45 degree while color cast of the first sub-pixel is smaller than about 0.0125. As shown in FIG. 3, because of the inclusion of the scattering layer 103, the viewing angle of the light emitting diode according to some embodiments of the present disclosure is significantly expanded to a range of about −50 degree to +50 degree from about −15 degree to +15 degree while the color cast thereof is maintained to be less than about 0.025. In some embodiments, because of the inclusion of the scattering layer 103, the viewing angle is expanded to be in a range of about −45 degree to +45 degree while the color cast thereof is less than about 0.025.

In some embodiments, a thickness of the scattering layer is in a range of about 0.02 μm to about 0.4 μm. In some embodiments, the scattering layer is made of $SiO_2$, $SiN_x$, or $SiO_xN_y$ or any of combination thereof. In some embodiments, surface roughness (Ra) of the scattering layer is in a range of about 0.01-0.2 μm according to a measurement method of GB1031-1983.

In some embodiments, as shown in FIG. 1, the light emitting diode 100 further includes a first reflective layer 300. The first microcavity adjustment layer 102 is formed on the first reflective layer 300. The first reflective layer 300 and the first semi-transparent electrode layer 106 form a first microcavity having a microcavity effect. The first microcavity adjustment layer 102 is configured to adjust length of the first microcavity to realize a strong microcavity effect. The scattering layer 103 is configured to reduce the strong microcavity effect of the first microcavity and hence improve the range of the viewing angle while reducing color cast due to the high microcavity effect.

In some embodiments, as shown in FIG. 2, the light emitting diode 100 further includes a reflective base substrate 101. The first microcavity adjustment layer 102 is formed on the reflective base substrate 101. The reflective base substrate 101 and the first semi-transparent electrode layer 106 form a first microcavity having a microcavity effect. The first microcavity adjustment layer 102 is configured to adjust length of the first microcavity to realize a strong microcavity effect. The scattering layer 103 is configured to reduce the strong microcavity effect of the first microcavity and hence improve the range of the viewing angle while reducing color cast due to the high microcavity effect.

In some embodiments, the first transparent electrode layer 104 is an anode layer and the first semi-transparent electrode layer 106 is a cathode layer.

In some embodiment, the scattering layer 103 includes a plurality of patterns and the patterns are irregularly or randomly arranged. In some embodiment, the plurality of irregularly or randomly arranged patterns includes a plurality of protuberances. In some embodiments, the plurality of protuberances is different from one another with regard to at least one of size, shape, direction or dimension thereof.

In some embodiments, as shown in FIG. 1, the scattering layer 103 is a separated or different layer from the first microcavity adjustment layer 102. The scattering layer 103 is disposed between the first microcavity adjustment layer 102 and the first transparent electrode layer 104. The scattering layer 103 includes a plurality of protuberances or protrusions or bulge. In some embodiments, the protuberances are made of a material which is different from the material of the first microcavity adjustment layer 102. In some embodiments, the protuberances are made of a material which is the same as the material of the first microcavity adjustment layer 102. As shown in FIG. 1, the scattering layer 103 further includes a plurality of recesses or gaps or grooves. As shown in FIG. 1, the scattering layer 103 includes at least three different kinds of protuberances and at least four recesses. In some embodiments, one or some of the plurality of recesses may be covered or filled by other material or layer such as the reflective electrode layer 104. In some embodiments, the scattering layer 103 contacts the first microcavity adjustment layer 102 directly. Other types of scattering layer may be used as long as the scattering layer can scatter the white light transmitting through it while it does not negatively affect the performance of the first sub-pixel.

In some embodiments, as shown in FIG. 2, the scattering layer 103 and the first microcavity adjustment layer 102 are formed in a single layer or formed as an integral layer or a single layer. That is, the scattering layer 103 is on a surface of the first microcavity adjustment layer 102 facing the first transparent electrode layer 104. The scattering layer 103 includes a plurality of protuberances or protrusions or bulge. The first microcavity adjustment layer 102 includes a plurality of protuberances and recesses and with at least one of the plurality of recesses between adjacent protuberances. In one embodiment, as shown in FIG. 2, the scattering layer 103 includes at least three different kinds of protuberances and four recesses. In some embodiments, thicknesses of the protuberances of the scattering layer 103 and those of protuberances of the first microcavity adjustment layer 102 along a direction substantially vertical to the base substrate 101 are substantially the same. In some embodiments, the thickness of the protuberances of the scattering layer 103 is in a range of 0.01 μm to about 0.4 μm.

In some embodiments, shape of the plurality of irregular patterns comprises at least one of square, rectangle, diamond, triangle or polygon. In some embodiments, the patterns are randomly or irregularly arranged.

Figure 4:
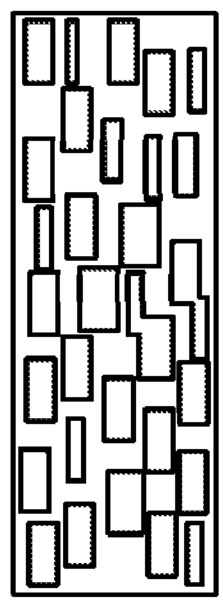
FIG. 4 shows random arrangements of patterns of a scattering layer according to some embodiments of the present disclosure.
Figure 5:
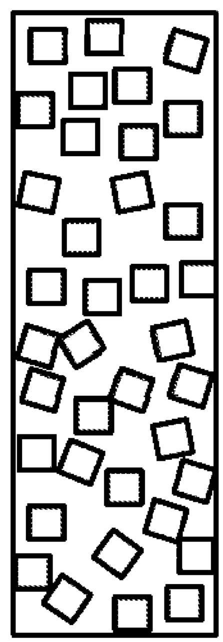
FIG. 5 shows random arrangements of patterns of a scattering layer according to some embodiments of the present disclosure.

FIG. 4 and FIG. 5 are two exemplary arrangements of the patterns of the scattering layer 103 according to some embodiments of the present disclosure. As shown in FIG. 4, the scattering layer 103 includes different types of rectangular and polygonal patterns and those patterns are randomly or irregularly arranged in the scattering layer. As shown in FIG. 5, the scattering layer 103 includes a plurality of square patterns, and the square patterns are arranged in random or irregular directions.

The random patterns of the scattering layer 103 can scatter the light transmitting through it, and accordingly reduce the microcavity effect of the first microcavity. Thus, the range of viewing angle can be increased while the color cast due to the high microcavity effect is significantly reduced. Thus, in the embodiments of the present disclosure, because the first sub-pixel 201 is configured to emit white light, the luminance of the light emitting diode 100 is highly improved. Furthermore, the color cast at large viewing angles is greatly reduced or at least partially eliminated due to inclusion of the scattering layer. As a result, the range of the viewing angle is greatly expanded.

In some embodiments, as shown in FIG. 1 and FIG. 2, the first sub-pixel 201 further includes a white color filter layer 108-1 on the first transparent electrode layer 106. The white color filter layer 108-1 may be a transparent layer. The white color filter layer 108-1 may be made of resin.

In some embodiments, as shown in FIG. 1 and FIG. 2, the pixel further includes a second sub-pixel 202, a third sub-pixel 203 and a fourth sub-pixel 204. The second sub-pixel 202 includes a second microcavity adjustment layer 2022, and the second sub-pixel 202 is configured to emit a first color 109. The third sub-pixel 203 includes a third microcavity adjustment layer 2032 and the third sub-pixel 203 is configured to emit a second color 110. The fourth sub-pixel 204 includes a fourth microcavity adjustment layer 2042 and the fourth sub-pixel 204 is configured to emit a third color 111. Thicknesses of the fourth microcavity adjustment layer 2042, the second microcavity adjustment layer 2022 and the third microcavity adjustment layer 2032 are different from one another. The first color 109, the second color 110 and the third color 111 are different colors. In some embodiments, the first color may be a red color, the second color may be a green color, and the third color may be a blue color. The thickness of the second microcavity adjustment layer 2022 is larger than the thickness of the third microcavity adjustment layer 2032, and the thickness of the microcavity adjustment layer 2032 is larger than the thickness of the fourth microcavity adjustment layer 2042. In one embodiment, the first sub-pixel 201 is a white sub-pixel and the thickness of the first microcavity adjustment layer 102 is the same as the thickness of the fourth microcavity adjustment layer 2042.

In some embodiments, the first microcavity adjustment layer 102 is has the same thickness as the fourth microcavity adjustment layer 2042, the second microcavity adjustment layer 2022, or the third microcavity adjustment layer 2032.

In some embodiments, as shown in FIG. 1, the light emitting diode 100 further includes a first reflective layer 300. The fourth microcavity adjustment layer 2042, the second microcavity adjustment layer 2022 and the third microcavity adjustment layer 2032 are on the first reflective layer 300. The second sub-pixel 202 further includes a second transparent electrode layer 2024 on the second microcavity adjustment layer 2022, a second emitting layer 2025 on the second transparent electrode layer 2024, and a second semi-transparent electrode layer 2026 on the second emitting layer 2025. The third sub-pixel 203 further includes a third transparent electrode layer 2034 on the third microcavity adjustment layer 2032, a third emitting layer 2035 on the third transparent electrode layer 2034, and a third semi-transparent electrode layer 2036 on the third emitting layer 2035. The fourth sub-pixel 204 further includes a fourth transparent electrode layer 2044 on the fourth microcavity adjustment layer 2042, a fourth emitting layer 2045 on the fourth transparent electrode layer 2044,and a fourth semi-transparent electrode layer 2046 on the fourth emitting layer 2045.

In some embodiments, the first reflective layer 300 and the second semi-transparent electrode layer 2026 form a second microcavity. The first reflective layer 300 and the third semi-transparent electrode layer 2036 form a third microcavity. The first reflective layer 300 and the fourth semi-transparent electrode layer 2046 form a fourth microcavity. Lengths of the second microcavity, the third microcavity, and the fourth microcavity are different from one another. In some embodiments, the length of the second microcavity is larger than the length of the third microcavity, and the length of the third microcavity is larger than the length of the fourth microcavity. In some embodiments, the length of the first microcavity is the same as the length of the second microcavity, the third microcavity, or the fourth microcavity. In some embodiments, the length of the first microcavity is the same as the length of the fourth microcavity. Thus, in the embodiments of the present disclosure, the colorful light emitted from the second sub-pixel, the third sub-pixel, and the fourth sub-pixel is greatly enhanced due to the strong microcavity effect.

In some embodiments, as shown in FIG. 1, the second sub-pixel 202 further includes a first color filter layer 108-4 on the second semi-transparent electrode layer 2026. The third sub-pixel 203 further includes a second color filter layer 108-3 on the third semi-transparent electrode layer 2036. The fourth sub-pixel 204 further includes a third color filter layer 108-2 on the fourth semi-transparent electrode layer 2046; and the first color filter layer 108-4, the second color filter layer 108-3 and the third color filter layer 108-2 are colorful filter layers different from the white color filter layer. In some embodiments, the first color filter layer 108-4 is a red color filter layer, the second color filter layer 108-3 is a green color filter layer, and the third color filter layer 108-2 is a blue color filter layer. The colorful filter layers such as the red color filter layer, the green color filter layer, and the blue color filter layer can significantly reduce the color cast at large viewing angles of the respective sub-pixels caused by the strong microcavity effect. Thus, the range of the viewing angles of the respective sub-pixels can be significantly increased while the color cast of the respective sub-pixels due to the strong microcavity effect is significantly reduced by the respective color filter layer.

The sub-pixels with the white sub-color filter layer 108-1 and the red, green and blue sub-color filter layers 108-4, 108-3 and 108-2 constitute a pixel unit with red, green, blue and white (RGBW) color filters.

In some embodiments, as shown in FIG. 1, the first sub-pixel 201 further includes a first sealing layer 107 or a first encapsulation layer on the first semi-transparent electrode layer 106. The second sub-pixel 202 further includes a second sealing layer 2027 or a second encapsulation layer on the second semi-transparent electrode layer 2026. The third sub-pixel 203 further includes a third sealing layer 2037 or a third encapsulation layer on the third semi-transparent electrode layer 2036. The fourth sub-pixel 204 further includes a fourth sealing layer 2047 or a third encapsulation layer on the fourth semi-transparent electrode layer 2046.

Another example of the present disclosure provides a display substrate. The display substrate includes the light emitting diode of any one of the above embodiments.

Another example of the present disclosure provides a display apparatus. The apparatus includes the above light emitting diode according to any one of the above embodiments of the present disclosure. In some embodiments, the display apparatus includes the array substrate according to one embodiment of the present disclosure. In some embodiments, the display apparatus includes the display substrate according to one embodiment of the present disclosure. The display apparatus may be any product or component having a display function, such as an electronic paper display, a mobile phone, a tablet computer, a TV set, a display, a notebook computer, a digital photo frame, a navigation device, and so on.

Some embodiments of the present disclosure provide a silicon-based OLED display apparatus with RGBW arrangement having strong microcavity effect, which can obtain ultra-high brightness (>3000 nit). At the same time, a scattering layer with randomly arranged protuberances is provided on the micro-cavity adjustment layer of the W sub-pixel. As such, the color cast of the W sub-pixel, which cannot be corrected by a CF, is significantly reduced in the embodiment of the present disclosure. As such, the RGBW silicon-based OLED apparatus has a wide viewing angle under ultra-high brightness ($\Delta u'v'<0.025$, −45°~+45°).

Figure 6:
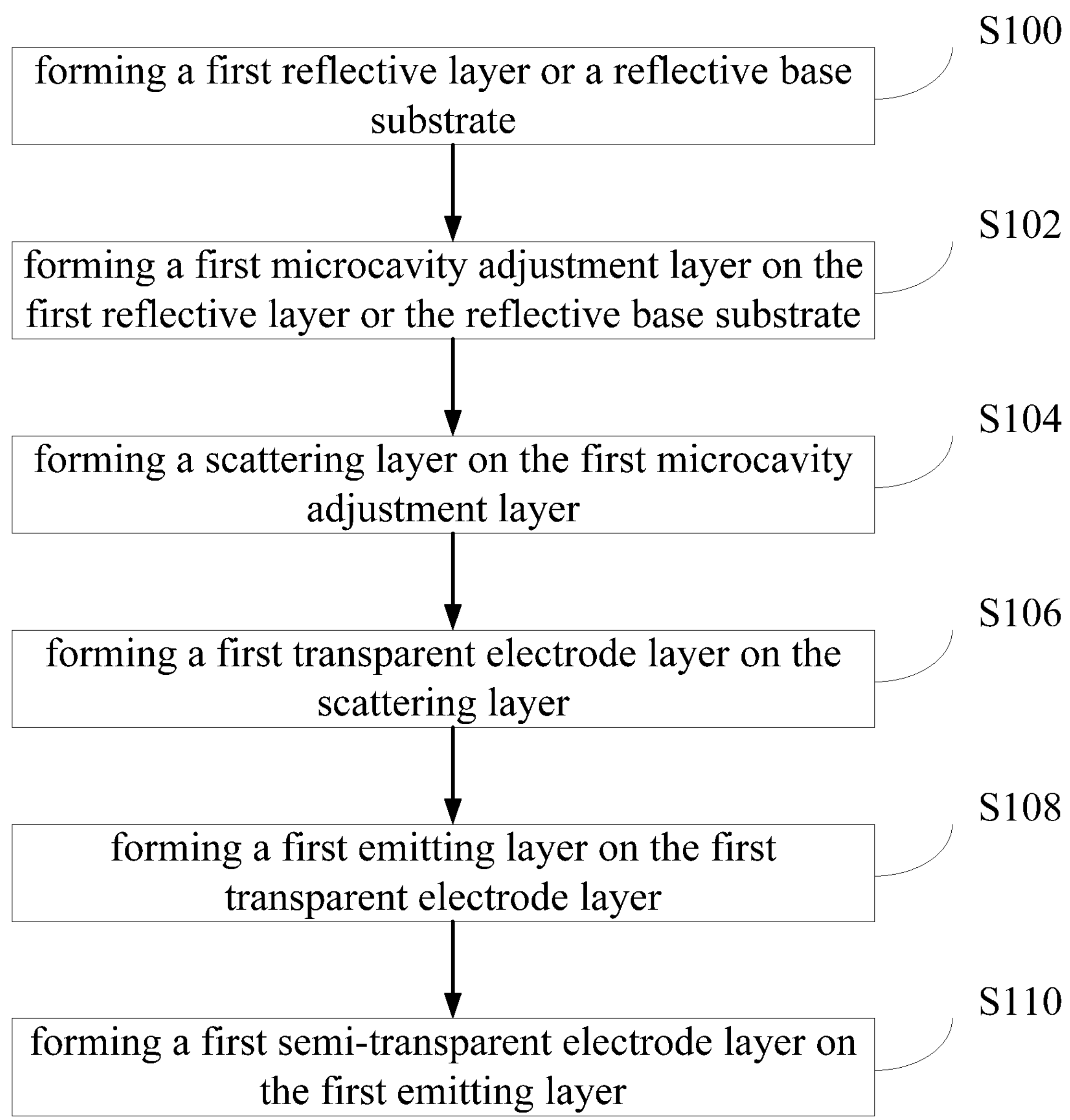
FIG. 6 is a flow chart of a fabrication method of a light emitting diode according to some embodiments of the present disclosure.

Another example of the present disclosure provides a method for fabricating a light emitting diode. In some embodiments, as shown in FIG. 6 the fabrication method includes the following steps S100 to S110.

Step S100 includes forming a first reflective layer or a reflective base substrate.

In some embodiments, the first reflective layer is formed on a base substrate such as a TFT array substrate. The material of the first reflective layer may include a metal such as aluminum, aluminum alloy, silver or silver alloy. The reflective metal layer may have a thickness in a range of about 80 nm to about 300 nm. The TFT array substrate may be a glass substrate, a plastic substrate, or a metal substrate.

In some embodiments, step S100 includes forming a reflective base substrate. The reflective base substrate may be formed by mixing a material of a base substrate with reflective metal material or particles. The reflective metal material may include a metal such as aluminum, aluminum alloy, silver or silver alloy. The particles may be made of aluminum, aluminum alloy, silver or silver alloy. In some embodiments, the base substrate may be a TFT array substrate, such as a glass substrate, a plastic substrate or a metal substrate.

In some embodiments, the first reflective layer is made of silver with a thickness of about 100 nm.

Step S102 includes forming a first microcavity adjustment layer on the first reflective layer or the reflective base substrate.

In some embodiments, a refractive index of the first microcavity adjustment layer may be greater than 1.7. The first microcavity adjustment layer may be made of a transparent material. In some embodiments, a thickness of the first microcavity adjustment layer is between about 100 nm to about 500 nm. The first microcavity adjustment layer may include a single layer or a plurality of stacked layers. In one embodiment, the first microcavity adjustment layer includes two or more stacked transparent films, with a layer of an oxide layer inserted between the two adjacent transparent films.

In one embodiment, the first microcavity adjustment layer is prepared as follows: a first layer of ITO thin film is deposited by magnetron sputtering on the reflective metal layer. Then, an IZO film is deposited on the first layer as an insertion layer. Finally a second layer of ITO thin film is deposited on the IZO film. The single first microcavity adjustment layer may be made of $SiO_2$ or a mixture of $SiO_2$ and Ag. The first microcavity adjustment layer may be made of $SiO_2$, $SiN_x$, or $SiO_xN_y$, or a combination thereof. The first microcavity adjustment layer may be made of a mixture including $SiO_2$, $SiN_x$, or $SiO_xN_y$, or a combination thereof, and Ag.

Step S104 includes forming a scattering layer on the first microcavity adjustment layer.

In some embodiments, a thickness of the scattering layer is in a range of about 0.02 μm to about 0.4 μm. In some embodiments, the scattering layer is made of $SiO_2$, $SiN_x$, or $SiO_xN_y$, or a combination thereof. In some embodiments, the scattering layer is made of at least one of $SiO_2$, $SiN_x$, or $SiO_xN_y$. In some embodiments, surface roughness (Ra) of the scattering layer is in a range of about 0.01-0.2 μm according to a measurement method of GB1031-1983.

In some embodiments, the scattering layer 103 includes a plurality of patterns and the patterns are irregularly or randomly arranged. In some embodiments, the plurality of irregularly or randomly arranged patterns includes protuberances and/or recesses. In some embodiments, the plurality of protuberances is different from one another with regard to at least one of size, shape, direction or dimension thereof.

In some embodiments, the scattering layer is formed by forming a thin $SiO_2$ layer on the first microcavity adjustment layer, followed by forming a plurality of patterns arranged randomly on the first microcavity adjustment layer using a mask. The scattering layer has an uneven surface in which the plurality of patterns is randomly arranged. The scattering layer is configured to scatter randomly the light transmitted through it.

In some embodiments, a planarization layer is formed on the scattering layer.

Step S106 includes forming a first transparent electrode layer on the scattering layer.

In some embodiments, the first transparent electrode layer may be made of Indium Tin Oxide (ITO), Indium Zinc Oxide (IZO), or Aluminum Zinc Oxide (AZO), or a combination thereof. In some embodiments, the first transparent electrode layer is an anode layer.

In some embodiments, the anode layer includes a metal oxide such as ITO or IZO, and/or a high work function metal or alloy, or a mixture of a high work function metal such as Au, Pt, Ag and a transparent material.

Step S108 includes forming a first emitting layer on the first transparent electrode layer.

In some embodiments, the first emitting layer is a WOLED layer to emit white light.

Step S110 includes forming a first semi-transparent electrode layer on the first emitting layer.

In some embodiments, the first semi-transparent electrode layer is a translucent cathode layer. In some embodiments, the translucent cathode layer may include a low work function metal material such as Li, Mg, Ca, Sr, La, Ce, Eu, Yb, Al, Cs, Rb or an alloy of these metals. These cathode materials may be used alone or in combination of two or more thereof. The translucent cathode low work function metal material may include a single low work function metal or a combination of the materials. A thickness of the translucent cathode may be in a range between 10 nm to 30 nm. The translucent cathode layer may be formed by a vacuum deposition method.

The light emitting diode formed by the above method can realize a viewing angle of the first sub-pixel in a range of about −50 degree to +50 degree while color cast of the first sub-pixel is smaller than about 0.025.

In some embodiments, the first microcavity adjustment layer 102 is formed on the reflective base substrate 101. The reflective base substrate 101 and the first semi-transparent electrode layer 106 form a first microcavity having a microcavity effect. The first microcavity adjustment layer 102 is configured to adjust length of the first microcavity to realize a strong microcavity effect. The scattering layer 103 is provided in the first sub-pixel and configured to reduce the strong microcavity effect of the first microcavity. Thus, the color cast due to the high microcavity effect at large viewing angles is significantly reduced. The scattering layer 103 can at least partially reduce disadvantages such as color deviation at different viewing angles.

In some embodiments, the light emitting diode may include at least one functional layer or a connecting layer in accordance with the function desired for the light emitting diode. The functional layer may be a hole injection layer, a hole transport layer, an electron injection layer or an electron transport layer, or a combination thereof.

The fabrication method may further include forming a white color filter layer on the first transparent electrode layer.

The fabrication method may further include forming a second sub-pixel, a third sub-pixel and a fourth sub-pixel.

In some embodiments, the first sub-pixel, the second sub-pixel, the third sub-pixel and the fourth sub-pixel are made according to the following steps S200 to S214.

Step S200 includes forming a first reflective layer at the positions where the first sub-pixel, the second sub-pixel, the third sub-pixel and the fourth sub-pixel are to be formed.

Step S202 includes forming a first microcavity adjustment layer, a second microcavity adjustment layer, a third microcavity adjustment layer and a fourth microcavity adjustment layer on the first reflective layers at the positions where the first sub-pixel, the second sub-pixel, the third sub-pixel and the fourth sub-pixel are to be formed. Thicknesses of the fourth microcavity adjustment layer, the second microcavity adjustment layer and the third microcavity adjustment layer are different from one another. A thickness of the first microcavity adjustment layer may be the same as that of the fourth microcavity adjustment layer, the second microcavity adjustment layer or the third microcavity adjustment layer.

Step S204 includes forming a scattering layer only on the first microcavity adjustment layer.

Step S206 includes forming an anode layer on the scattering layer, the fourth microcavity adjustment layer, the second microcavity adjustment layer and the third microcavity adjustment layer. In some embodiments, the anode layer includes a plurality of sub-anode layers with each located at the position where the first sub-pixel, the second sub-pixel, the third sub-pixel and the fourth sub-pixel are to be formed respectively. In some embodiments, the anode layer is a continuous layer covering the scattering layer, the fourth microcavity adjustment layer, the second microcavity adjustment layer and the third microcavity adjustment layer.

Step S208 includes forming a first emitting layer at the position where the first sub-pixel is to be formed, a second emitting layer at the position where the second sub-pixel is to be formed, a third emitting layer at the position where the third sub-pixel is to be formed, and a fourth emitting layer at the position where the fourth sub-pixel is to be formed.

Step S210 includes forming a semi-transparent electrode layer on the first emitting layer, the second emitting layer, the third emitting layer, and the fourth emitting layer. In some embodiments, the semi-transparent electrode layer is a cathode layer. In some embodiments, the cathode layer is a continuous layer covering all the first emitting layer, the second emitting layer, the third emitting layer, and the fourth emitting layer. In some embodiments, the cathode layer includes a plurality of sub-cathode layers with each located at the position where the first sub-pixel, the second sub-pixel, the third sub-pixel and the fourth sub-pixel are to be formed respectively. In some embodiment, the semi-transparent electrode layer includes a first semi-transparent electrode layer, a second semi-transparent electrode layer, a third semi-transparent electrode layer, and a fourth semi-transparent electrode layer on the first emitting layer, the second emitting layer, the third emitting layer, and the fourth emitting layer respectively.

Step S212 includes forming a first sealing layer or a first encapsulation layer on the first semi-transparent electrode layer, a second sealing layer or a second encapsulation layer on the second semi-transparent electrode layer, a third sealing layer or a third encapsulation layer on the third semi-transparent electrode layer, and a fourth sealing layer or a fourth encapsulation layer on the fourth semi-transparent electrode layer.

Step S214 includes forming a white color filter layer on the first sealing layer or the first encapsulation layer, a red color filter layer on the second sealing layer or the second encapsulation layer, a green color filter layer on the third sealing layer or the third encapsulation layer, and a blue color filter layer on the fourth sealing layer or the fourth encapsulation layer.

In some embodiments, the reflective base substrate and the first semi-transparent electrode layer form a first microcavity having a microcavity effect. The first microcavity adjustment layer is configured to adjust length of the first microcavity to realize a strong high microcavity effect. The scattering layer is configured to reduce the strong microcavity effect of the first microcavity and hence reduce color cast at large viewing angles due to the high microcavity effect.

The principle and the embodiment of the disclosure are set forth in the specification. The description of the embodiments of the present disclosure is only used to help understand the method of the present disclosure and the core idea thereof. Meanwhile, for a person of ordinary skill in the art, the disclosure relates to the scope of the disclosure, and the technical embodiment is not limited to the specific combination of the technical features, and also should covered other technical embodiments which are formed by combining the technical features or the equivalent features of the technical features without departing from the inventive concept. For example, technical embodiments may be obtained by replacing the features described above as disclosed in this disclosure (but not limited to) with similar features.

What is claimed is:

1. A light emitting diode, comprising:

a pixel unit comprising a first sub-pixel configured to emit white light; wherein:

the first sub-pixel comprises:

a first microcavity adjustment layer;

a scattering layer;

a first transparent electrode layer;

a first emitting layer; and a first semi-transparent electrode layer;

wherein the scattering layer is disposed on the first microcavity adjustment layer, the first transparent electrode layer is disposed on the scattering layer, the first emitting layer is disposed on the first transparent electrode layer;

the scattering layer includes a plurality of patterns formed on a surface of the scattering layer;

the scattering layer and the first microcavity adjustment layer are made of a same material; and the scattering layer is formed on a surface of the first microcavity adjustment layer facing the first transparent electrode layer and the scattering layer includes a plurality of recesses and a plurality of protuberances.

2. The light emitting diode of claim 1, further comprising a first reflective layer; wherein:

the first microcavity adjustment layer is on the first reflective layer;

the first reflective layer and the first semi-transparent electrode layer form a first microcavity having a microcavity effect; and the scattering layer is configured to scatter the white light transmitting through the scattering layer and reduce the microcavity effect of the first microcavity.

3. The light emitting diode of claim 1, further comprising a reflective base substrate; wherein:

the first microcavity adjustment layer is on the reflective base substrate;

the reflective base substrate and the first semi-transparent electrode layer form a first microcavity having a microcavity effect; and the scattering layer is configured to scatter the white light transmitting through the scattering layer and reduce the microcavity effect of the first microcavity.

4. The light emitting diode of claim 1, wherein:

the plurality of patterns have rectangle shapes with different sizes or different rotations.

5. The light emitting diode of claim 1, wherein:

the plurality of patterns are randomly arranged.

6. The light emitting diode of claim 1, wherein:

a surface roughness of the scattering layer is in a range of about 0.01 μm to about 0.2 μm.

7. The light emitting diode of claim 1, wherein:

a thickness of the scattering layer is in a range of about 0.02 μm to about 0.4 μm.

8. The light emitting diode of claim 1, wherein:

the first sub-pixel further comprises a white color filter layer on the first transparent electrode layer.

9. The light emitting diode of claim 1, wherein:

the pixel unit further comprises a second sub-pixel, a third sub-pixel and a fourth sub-pixel;

the second sub-pixel comprises a second microcavity adjustment layer and is configured to emit a first color;

the third sub-pixel comprises a third microcavity adjustment layer and is configured to emit a second color;

the fourth sub-pixel comprises a fourth microcavity adjustment layer and is configured to emit a third color;

thicknesses of the fourth microcavity adjustment layer, the second microcavity adjustment layer and the third microcavity adjustment layer are different from one another; and the first color, the second color and the third color are different colors.

10. The light emitting diode of claim 9, wherein:

a thickness of the first microcavity adjustment layer is the same as a thickness of the fourth microcavity adjustment layer, the second microcavity adjustment layer or the third microcavity adjustment layer.

11. The light emitting diode of claim 9, further comprising a first reflective layer; wherein:

the fourth microcavity adjustment layer, the second microcavity adjustment layer and the third microcavity adjustment layer are on the first reflective layer;

the second sub-pixel further comprises a second transparent electrode layer on the second microcavity adjustment layer, a second emitting layer on the second transparent electrode layer, and a second semi-transparent electrode layer on the second emitting layer;

the third sub-pixel further comprises a third transparent electrode layer on the third microcavity adjustment layer, a third emitting layer on the third transparent electrode layer, and a third semi-transparent electrode layer on the third emitting layer;

the fourth sub-pixel further comprises a fourth transparent electrode layer on the fourth microcavity adjustment layer, a fourth emitting layer on the fourth transparent electrode layer, and a fourth semi-transparent electrode layer on the fourth emitting layer.

12. The light emitting diode of claim 11, wherein:

the first reflective layer and the second semi-transparent electrode layer form a second microcavity;

the first reflective layer and the third semi-transparent electrode layer form a third microcavity;

the first reflective layer and the fourth semi-transparent electrode layer form a fourth microcavity; and lengths of the second microcavity, the third microcavity, and the fourth microcavity are different from one another.

13. The light emitting diode of claim 12, wherein:

a length of the first microcavity is the same as a length of the second microcavity, the third microcavity or the fourth microcavity.

14. The light emitting diode of claim 9, wherein:

the second sub-pixel further comprises a first color filter layer on the second semi-transparent electrode layer;

the third sub-pixel further comprises a second color filter layer on the third semi-transparent electrode layer;

the fourth sub-pixel further comprises a third color filter layer on the fourth semi-transparent electrode layer; and the first color filter layer, the second color filter layer and the third color filter layer are colorful filter layers.

15. A display substrate comprising the light emitting diode of claim 1.

16. A display apparatus comprising the display substrate of claim 15.

17. A method of fabricating a light emitting diode, comprising:

forming a first microcavity adjustment layer in a first sub-pixel configured to emit white light;

forming a scattering layer on the first microcavity adjustment layer;

forming a first transparent electrode layer on the scattering layer;

forming a first emitting layer on the first transparent electrode layer; and forming a first semi-transparent electrode layer on the first emitting layer; wherein:

the scattering layer includes a plurality of patterns.

18. The method of claim 17, further comprising forming a first reflective layer before the forming the first microcavity adjustment layer so as to form the first microcavity adjustment layer on the first reflective layer; wherein:

the first reflective layer and the first semi-transparent electrode layer form a first microcavity having a microcavity effect; and the scattering layer is configured to reduce the microcavity effect of the first microcavity.

19. The method of claim 17, further comprising forming a reflective base substrate before the forming the first microcavity adjustment layer so as to form the first microcavity adjustment layer on the reflective base substrate; wherein:

the reflective base substrate and the first semi-transparent electrode layer form a first microcavity having a microcavity effect; and the scattering layer is configured to reduce the microcavity effect of the first microcavity.

* * * * *